United States Patent
Schaffer

(10) Patent No.: US 11,258,414 B2
(45) Date of Patent: Feb. 22, 2022

(54) COMPACT OFFSET DRIFT TRIM IMPLEMENTATION

(71) Applicant: Texas Instruments Incorporated, Dallas, TX (US)

(72) Inventor: Viola Schaffer, Freising (DE)

(73) Assignee: Texas Instruments Incorporated, Dallas, TX (US)

(*) Notice: Subject to any disclaimer, the term of this patent is extended or adjusted under 35 U.S.C. 154(b) by 95 days.

(21) Appl. No.: 16/803,514

(22) Filed: Feb. 27, 2020

(65) Prior Publication Data

US 2021/0273620 A1    Sep. 2, 2021

(51) Int. Cl.
*H03F 3/45* (2006.01)
*H03F 1/30* (2006.01)

(52) U.S. Cl.
CPC ......... *H03F 3/45766* (2013.01); *H03F 1/301* (2013.01); *H03F 3/45085* (2013.01); *H03F 2200/375* (2013.01); *H03F 2200/447* (2013.01); *H03F 2203/45212* (2013.01)

(58) Field of Classification Search
CPC .. H03F 3/45766; H03F 3/45085; H03F 1/301; H03F 2200/447; H03F 2200/375; H03F 2203/45212
USPC ........................................ 330/252, 253, 255
See application file for complete search history.

(56) References Cited

U.S. PATENT DOCUMENTS

| | | | |
|---|---|---|---|
| 4,538,114 A * | 8/1985 | Kunimi | H03F 3/45192 330/253 |
| 5,200,654 A | 4/1993 | Archer | |
| 5,386,160 A | 1/1995 | Archer et al. | |
| 7,109,697 B1 | 9/2006 | Atrash et al. | |
| 7,358,809 B2 * | 4/2008 | Elder | H03F 1/30 330/253 |
| 8,212,606 B2 | 7/2012 | Snoeij et al. | |
| 10,530,308 B2 | 1/2020 | Balasubramanian et al. | |
| 2002/0125950 A1 * | 9/2002 | Abe | H03F 3/45219 330/253 |
| 2007/0159249 A1 * | 7/2007 | Nishimura | H03F 3/45192 330/253 |

* cited by examiner

*Primary Examiner* — Khanh V Nguyen
(74) *Attorney, Agent, or Firm* — John R. Pessetto; Charles A. Brill; Frank D. Cimino

(57) ABSTRACT

Disclosed embodiments include a method for reducing amplifier offset drift comprised of receiving a first differential input signal at a first transistor base terminal and a second differential input signal at a second transistor base terminal, coupling the collector of the first transistor to the emitter of a third transistor and the emitter of the second transistor to the emitter of a fourth transistor, then coupling the base of the third transistor to the base of the fourth transistor. The method is also comprised of coupling the collector of the fourth transistor to an output terminal, generating a temperature dependent error correction current to minimize the difference in the amount of current flowing through the third transistor and the amount of current flowing through the fourth transistor, then injecting the error correction current into the emitter terminal of at least one of either the third transistor or the fourth transistor.

20 Claims, 3 Drawing Sheets

COMPACT OFFSET DRIFT TRIM IMPLEMENTATION

BACKGROUND

If both inputs of an operational amplifier (op amp) are at exactly the same voltage, the op amp output would ideally be zero volts. In practice, however, a non-zero output is expected due to small component differences in the input paths of a non-ideal op amp. The offset voltage of an op amp is equal to the direct current (DC) voltage that must be applied between the two inputs of the op amp to obtain a zero volt output.

If the offset voltage was a constant value over different temperatures and operating conditions, it would be relatively simple to compensate for that offset voltage using well-known calibration and/or trim methods. However, the offset voltage is not constant over varying ambient operating temperatures. The change in offset voltage due to changes in operating temperature is known as temperature offset drift.

Some op amp manufacturers have tried to compensate for offset voltages, and the error caused by the offset voltages, by calibrating/trimming the op amp at room temperature. However, that offset calibration/trim may only be effective at the temperature the calibration/trim was performed. This temperature offset drift leads to increasing error in the amplifier output as the temperature changes and gets farther from the temperature at which the calibration was performed.

SUMMARY

Example embodiments include a method for reducing offset drift in an amplifier comprised of receiving a first differential input signal at the base terminal of a first transistor and a second differential input signal at the base terminal of a second transistor, coupling the collector terminal of the first transistor to the emitter terminal of a third transistor and coupling the emitter terminal of the second transistor to the emitter terminal of a fourth transistor. The base terminal of the third transistor is coupled to the base terminal of the fourth transistor. The method is further comprised of coupling the collector terminal of the fourth transistor to an output terminal, then generating a temperature dependent error correction current to minimize the difference in the amount of current flowing through the third transistor and the amount of current flowing through the fourth transistor. The error correction current is then injected into the emitter terminal of at least one of either the third transistor or the fourth transistor.

A second example embodiment includes a circuit comprising a first transistor having a first base, a first emitter, and a first collector wherein the first base is coupled to a first differential input terminal and the first collector is coupled to a first terminal of an error correction circuit, and additionally comprising a second transistor having a second base, a second emitter, and a second collector wherein the second base is coupled to a second differential input terminal, the second emitter is coupled to the first emitter, and the second collector is coupled to a second terminal of the error correction circuit. There is also a third transistor having a third base, a third emitter, and a third collector wherein the third emitter is coupled to the first terminal of the error correction circuit. There is a fourth transistor having a fourth base, a fourth emitter, and a fourth collector wherein the fourth base is coupled to the third base and the fourth emitter is coupled to the first terminal of the error correction circuit. There is also an output amplifier stage with an input coupled to the fourth collector and an output coupled to an output terminal.

A third example embodiment includes an error correction circuit comprising a first transistor having a first base, a first emitter, and a first collector wherein the first collector is coupled to a current source through a first resistor, and the first base is coupled to a first differential voltage error node and to the first emitter through a second resistor and a third resistor. There is a second transistor having a second base, a second emitter, and a second collector wherein the second collector is coupled to the current source through a fourth resistor, the second base is coupled to a second differential voltage error node through a fifth resistor and to the second emitter through the fifth resistor and a sixth resistor. There is a transconductance stage having a differential input and a differential output wherein the differential input is coupled to the first differential voltage error node and the second differential voltage error node, and differential output is coupled to a first differential current error node and a second differential current error node. There is also a polarity selection switch having as inputs the first differential current error node and the second differential current error node, and having a differential correction current as an output.

While the example embodiments include bipolar junction transistors (BJTs), the embodiments are also applicable to metal oxide semiconductor (MOS) transistors. Furthermore, the transistors of the example embodiments may include: NPN, PNP, NMOS, or PMOS transistors.

Like reference symbols in the various drawings indicate like elements. Details of one or more implementations of the present disclosure are set forth in the accompanying drawings and the description below. The figures are not drawn to scale and they are provided merely to illustrate the disclosure. Specific details, relationships, and methods are set forth to provide an understanding of the disclosure. Other features and advantages may be apparent from the description and drawings, and from the claims.

DETAILED DESCRIPTION

An example embodiment includes a circuit that generates a temperature dependent differential current having a controlled zero point and slope that counteracts the effects of temperature on output error due to temperature offset drift. The baseline ambient operating temperature, which may be at or near room temperature in some cases, is a temperature where the output differential current is calibrated to be as close to zero as possible with known calibration/trimming methods.

Figure 1:
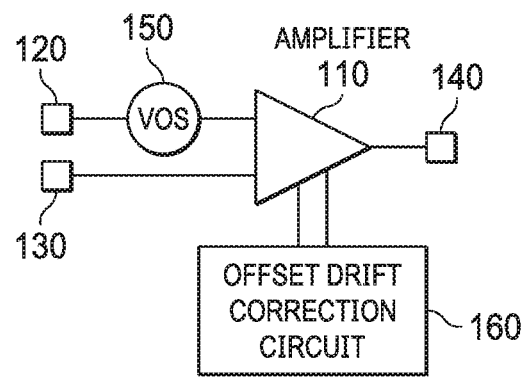
FIG. 1 shows a block diagram of an op amp circuit with differential inputs depicting offset error sources as an input and an error correction circuit to minimize the effects of the offset error sources.

FIG. 1 shows an op amp 110 with differential inputs 120 and 130 and an output 140. Voltage source 150 represents the offset voltage, $V_{OS}$, that can be applied to an input of an op amp 110 to account for the offset error in op amp 110.

While a single input to the op amp 110 is used to account for the offset error of op amp 110, the offset error can be from numerous error sources internal to the op amp 110. This offset voltage error is undesirable and degrades the accuracy of the op amp, especially if it varies with varying operating conditions, including temperature, if it is not corrected. In an example embodiment, an offset drift correction circuit 160 is added to the op amp 110 to minimize the offset voltage error, particularly the portion of the offset voltage error that is temperature-dependent.

The offset drift correction circuit 160 minimizes the variations in offset voltage error due to variations in temperature so that the applied offset voltage $V_{OS}$ 150 can remain relatively constant over temperature. Hence, with the addition of offset drift correction circuit 160, the remaining offset voltage error is essentially constant over temperature, and the offset voltage error can be reduced to a minimal value using existing offset trimming techniques performed at the baseline ambient operating temperature.

Figure 2:
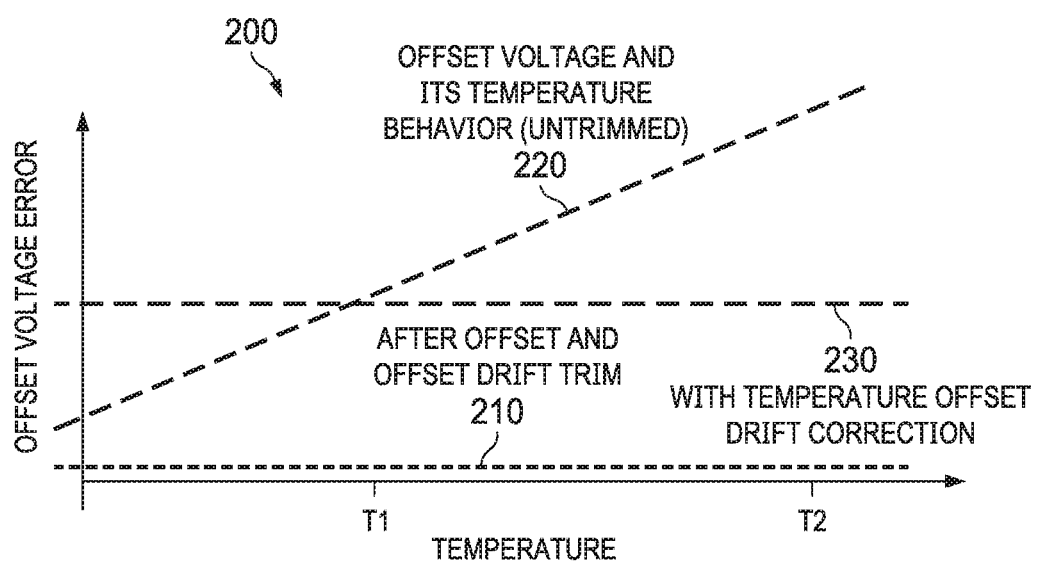
FIG. 2 shows an exemplary graph of offset voltage error as a function of temperature.

To illustrate the temperature offset drift correction of an example embodiment, FIG. 2 shows an exemplary graph 200 of offset voltage error as a function of temperature. Line 210 shows the ideal behavior for offset voltage error over temperature for a non-ideal op amp. For line 210, the offset voltage error is a minimal value at the baseline ambient operating temperature and remains essentially the same value for all temperatures. In an ideal case, the offset voltage error would be zero and would remain zero over the entire temperature range (i.e. the graph would have a slope of zero for all temperatures and would intersect the y-axis at the origin).

Line 220 shows an exemplary graph of uncorrected offset voltage error versus temperature for a non-ideal op amp. Line 220 shows an offset voltage error at the baseline ambient operating temperature that is greater than zero. Additionally, there is a non-zero slope to line 220 indicating that the offset voltage error increases linearly with temperature. It is possible to minimize the offset voltage error of the op amp at one temperature with known compensation/trim methods, but those adjustments will only minimize the offset voltage error at the temperature at which the compensation/trim method is performed on the op amp. Due to temperature offset drift, the offset voltage error will increase as the operating temperature of the op amp gets farther from the temperature at which the trim adjustment was performed.

Line 230 shows an exemplary graph of offset voltage error versus temperature with temperature offset drift correction in accordance with example embodiments. Line 230 does not reflect having performed a trim adjustment at the baseline ambient operating temperature, so the offset voltage error is not zero at the baseline ambient operating temperature. However, the slope of line 230 is near-zero, or at least minimal. Having minimal slope means that the offset voltage error remains relatively constant as the ambient operating temperature varies, giving the graph an almost flat line. If desired, the user can perform an offset error trim adjustment at a baseline ambient operating temperature to shift the graph to near the x-axis. If this offset error trim adjustment is performed, then the graph of line 230 will then approximate the graph of line 210, meaning that the graph will have near-zero slope over temperature, but can also have near-zero offset voltage error as the temperature varies.

Example embodiments minimize the temperature dependence of the offset voltage error, and thereby, minimize the slope of the offset voltage error versus temperature response. This minimization is accomplished by the addition of an offset drift correction circuit 160 of the example embodiment shown in FIG. 1. In the example embodiment, offset drift correction circuit 160 generates a correction current that preferably adds little to no offset voltage error at the baseline ambient operating temperature, and has an opposite temperature dependence from the offset voltage error. This correction current is injected into the op amp to correct for and minimize the offset voltage error due to temperature effects. A separate trim operation at a baseline ambient operating temperature can be performed to minimize the total overall offset voltage error.

Figure 3:
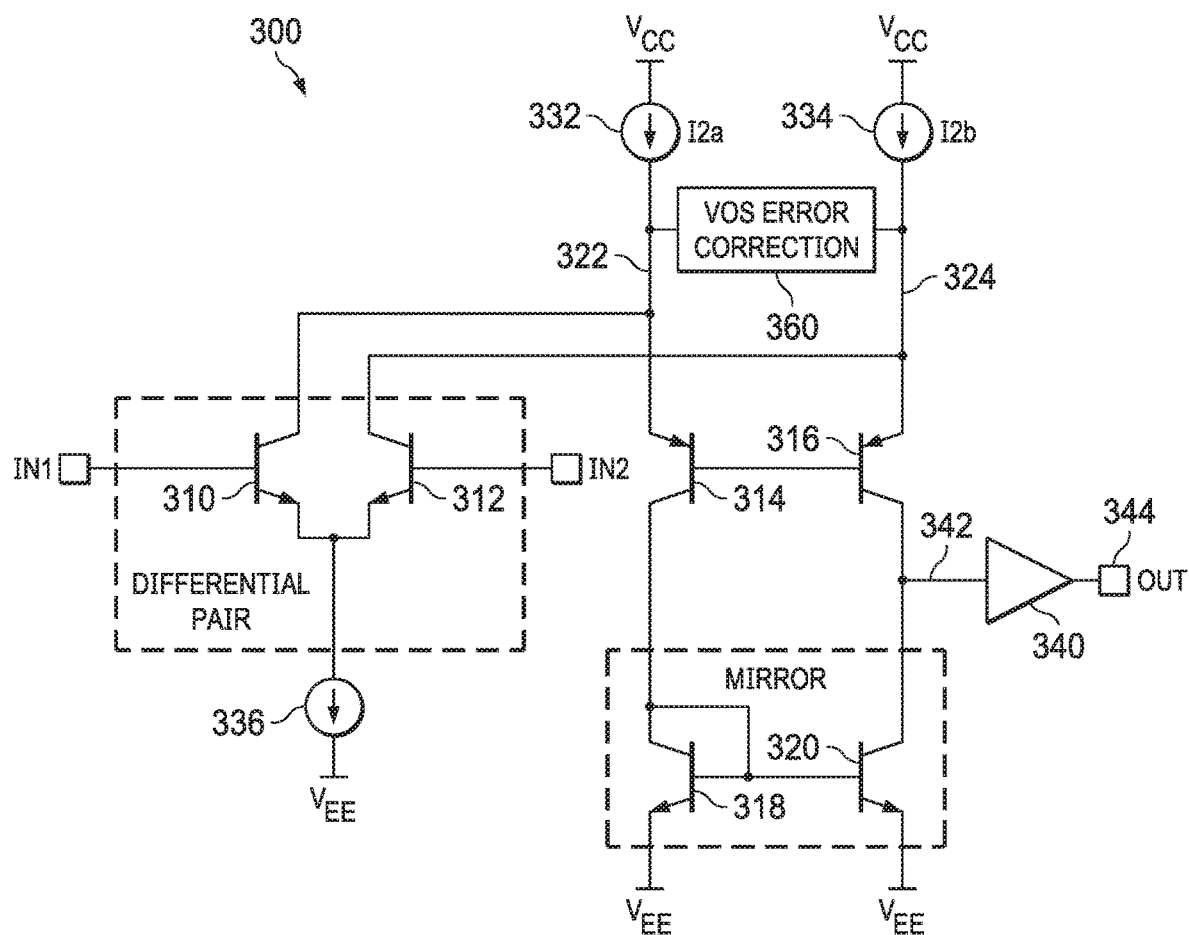
FIG. 3 is a schematic diagram of an example embodiment of an op amp using an offset drift correction current.

FIG. 3 shows an op amp circuit 300 with an offset drift correction current of an example embodiment applied to the input of the op amp for the purpose of minimizing a slope of an offset voltage error versus temperature. Transistors 310 and 312 form a differential pair. The base terminal of transistor 310 is coupled to differential input IN1 of op amp 300. The base terminal of transistor 312 is coupled to differential input IN2 of op amp 300. The output 344, OUT, of op amp 300 is at the output of amplifier 340.

Current sources 332 and 334 are supplied by a supply voltage source, $V_{CC}$. The non-supply terminal 322 of current source 332 is coupled to the emitter terminal of transistor 314 and to the collector terminal of transistor 310. The non-supply terminal 324 of current source 334 is coupled to the emitter terminal of transistor 316 and to the collector terminal of transistor 312. The base terminals of transistors 314 and 316 are coupled together. Transistors 314 and 316 are cascoding devices that increase the output impedance of the stage of the circuit that feeds amplifier stage 340. The base terminals of transistors 318 and 320 are coupled together and form a current mirror so that approximately the same current that goes through transistor 318 is mirrored through transistor 320.

If no offset drift error was present, approximately the same current would be supplied by current source 332 as is supplied by current source 334, and the current through transistor 314 would be approximately equal to the current through transistor 316. However, if there is any offset in the input differential stage transistors 310 and 312, one of those transistors may draw either a little more or a little less current than the other transistor due to that offset. Without the addition of VOS error correction circuit 360, which is analogous to the offset drift correction circuit 160 in FIG. 1, this difference in the current drawn by transistors 310 and 312 would result in a difference in current through transistors 314 and 316. A difference in current through transistors 314 and 316 would cause an imbalance at node 342, and the imbalance would propagate through amplifier stage 340 to the output 344 creating an output voltage error.

However, with the error correction circuit of an example embodiment, such as VOS error correction circuit 360, coupled between nodes 322 and 324, the VOS error correction circuit 360 can inject a current that is opposite of the imbalance current into the circuit so that transistors 314 and 316 will have approximately the same current flowing through them. If the current through transistors 314 and 316 is nearly the same, then the output voltage error at 344 will be minimal because the imbalance at 342 is minimal. It should be noted that while FIG. 3 shows the output 344 as a single-ended output, this same scheme could also be applied to a differential output.

The collector terminal of transistor 314 is coupled to both the collector and base terminals of transistor 318. The collector terminal of transistor 316 is coupled to the collector terminal of transistor 320 and to the input 342 of amplifier stage 340.

The emitter terminals of transistors 310 and 312 are coupled together and are coupled to a first terminal of a third current source 336. The current source 336 biases the input transistors 310 and 312 to ensure their proper turn-on and operation. The voltage at $V_{EE}$ can either be ground or can be a negative voltage. The emitter terminals of transistors 318 and 320 are also coupled to $V_{EE}$. In at least one example embodiment, transistors 310, 312, 314, 316, 318 and 320 are BJTs. However, in other embodiments, transistors 310, 312, 314, 316, 318 and 320 can be field effect transistors (FETs) with the source terminals corresponding to the emitter terminals, the gate terminals corresponding to the base terminals, and the drain terminals corresponding to the collector terminals.

It is desirable that current sources 332 and 334 have identical parameters and output currents, but it is likely that there will be some mismatch in their output currents. Mismatch errors between current source 332 and current source 334 can lead to an offset voltage error.

Mismatch errors between transistor 310 and transistor 312 can also lead to an offset voltage error. In the same way, mismatch errors between transistors 314 and 316 and between transistors 318 and 320 can also lead to offset voltage errors. This is not an exhaustive list of potential offset voltage error sources, but it illustrates that there are numerous potential sources for offset voltage errors within a typical op amp circuit.

In addition to the current correction mentioned above, the correction current generated by the VOS error correction circuit 360 can be varied by VOS error correction circuit 360 to counteract and minimize the op amp's offset voltage temperature drift. As shown in the example embodiment of FIG. 3, the output current from the VOS error correction circuit 360 can be injected into the collector terminals of the input differential pair transistors 310 and 312. However, in other embodiments, the output current from the VOS error correction circuit 360 can instead be injected into the collector terminals of transistors 318 and 320.

Figure 4:
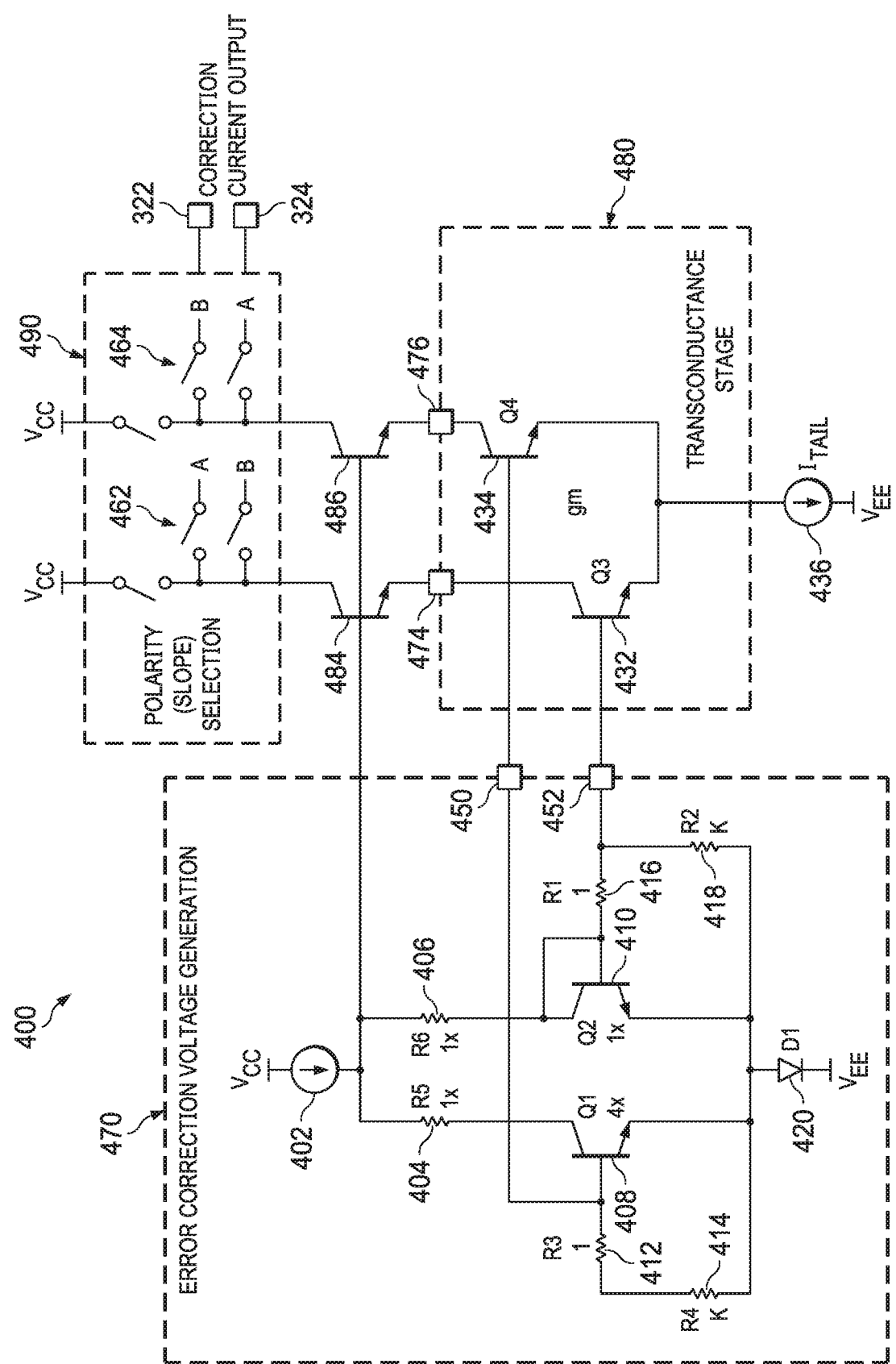
FIG. 4 shows a schematic of an example embodiment of an offset voltage error correction circuit.

FIG. 4 is a schematic of an example embodiment 400 of the VOS error correction circuit 360 from FIG. 3. The output terminals 322 and 324 in FIG. 4 correspond to the current output terminals 322 and 324 of VOS error correction circuit 360 in FIG. 3.

The VOS error correction circuit 400 includes three stages. The three stages are an error correction voltage generation stage 470, a transconductance stage 480, and a direction or current polarity selection stage 490.

If a compensation/trim was performed for the op amp at the baseline ambient operating temperature, the error correction voltage generation stage 470 generates an error correction voltage that is, preferably, approximately zero at a baseline ambient operating temperature, which could be at room temperature, and has a predictable behavior over the complete temperature range. The output of the voltage generation stage 470 is a voltage, $\Delta V$, which is the voltage difference between terminals 450 and 452.

The error correction voltage $\Delta V$ is generated by the difference of two voltages. One voltage increases proportionally with temperature and the other voltage decreases proportionally with temperature. The voltage that increases proportionally with temperature is $\Delta V_{BE}$, which is the difference in the base-to-emitter voltages of transistors 408 and 410. The voltage that decreases proportionally with temperature is $V_{BE2}$ which is the base-to-emitter voltage of transistor 410. Transistors 408 and 410 are designed with different size emitters. For example, in one embodiment, the emitter of transistor 408 may be four times as large as the emitter of transistor 410, but other ratios are possible. This difference in the size of the emitters of transistors 408 and 410 will lead to a difference in the base-to-emitter voltage between transistor 408 and transistor 410.

The base-to-emitter voltage of transistor 410 $V_{BE2}$ is multiplied by a scale factor $1/(1+K)$, where the value of K is determined by a resistor voltage divider made up of resistor 418 (R2) and resistor 416 (R1). The error correction voltage $\Delta V$ is given by the equation:

$$\Delta V = \Delta V_{BE} - 1/(1+K) * V_{BE2} \text{ where } K = R1/(R1+R2).$$

The values of resistor 418 (R2) and resistor 416 (R1), and thus the value of K, are chosen such that the error correction voltage $\Delta V$ is approximately zero at the baseline ambient operating temperature. The value of K should be chosen such that when $V_{BE2}$ is multiplied by $1/(1+K)$, the resulting value is approximately equal to $\Delta V_{BE}$ at the baseline ambient operating temperature. As the temperature increases or decreases, the error correction voltage $\Delta V$ will increase or decrease to counteract the temperature effects on offset.

Diode 420 shifts the voltage level at the emitter terminals of transistor 408 and transistor 410 above $V_{EE}$. Resistor 404 and resistor 406 show one example of an embodiment to implement a current source to bias transistors 408 and 410, respectively, but other embodiments are possible. Resistors 412 and 414 provide symmetry with resistors 416 and 418. While the circuit will still operate without resistors 412 and 414, performance of the circuit will be compromised by creating an additional error source due to the lack of symmetry caused by resistors 416 and 418 providing a second current path around transistor 410. To minimize this potential error source, it is desirable to match the sum of the values of resistors 412 and 414 with the sum of the values of resistors 416 and 418.

The transconductance stage 480 converts the error correction voltage $\Delta V$ into a current. The error correction voltage $\Delta V$ is input to the transconductance stage 480 as a differential voltage at terminals 450 and 452. The output of the transconductance stage is a differential current, the error correction current $\Delta I$, at terminals 474 and 476. The error correction current can be calculated according to the following equation:

$$\text{Error Correction Current} = \Delta I = gm(\Delta V)$$

The transconductance value gm is set by the current source 436. In at least one example embodiment, the current from current source 436 is constant, so that there are three possible error correction choices that may be chosen in the polarity selection stage 490. Those three error correction levels are no correction current applied, positive correction current applied, and negative correction current applied. However, in other implementations, the current source can be scaled for multiple levels to introduce a multiplication factor to the error correction current equation, and therefore achieve multiple levels of trimming.

The polarity selection stage 490 determines whether the error correction current applied to the op amp at terminals 322 and 324 is positive or negative in polarity. The input to the polarity selection stage 490 is a differential current from terminals 474 and 476 of the transconductance stage 480. Transistors 484 and 486 are cascading transistors which increase the output impedance of the transconductance stage 480. While transistors 484 and 486 are not essential to the operation of the circuit, performance might be compromised in some cases if they are omitted. The output of polarity selection stage 490 is a differential error correction current at terminals 322 and 324. The error correction current at terminals 322 and 324 is fed to the collector terminals of the input differential pair transistors 310 and 312 to correct for the offset error due to temperature.

The polarity selection switches 462 and 464 have three possible positions. The three possible switch positions are: (i) switch A selected and switch B not selected; switch B selected and switch A not selected; or with neither switch A nor switch B selected. Selecting both switch A and switch B at the same time is not an allowed condition. If neither switch A nor switch B of the polarity selection switches 462 and 464 is selected, then the collector of transistors 484 and 486 will be connected to the positive supply rail, $V_{CC}$.

If switch A of the polarity selection switches 462 and 464 is selected, then the collector terminal of transistor 484 will be connected to terminal 322, and the collector terminal of transistor 486 will be connected to terminal 324. This will result in a correction current having a positive slope with increasing temperature being applied to the op amp circuit.

If switch B of the polarity selection switches 462 and 464 is selected, then the collector terminal of transistor 484 will be connected to terminal 324, and the collector terminal of transistor 486 will be connected to terminal 322. This will result in a correction current with a negative slope with increasing temperature being applied to the op amp circuit.

For the purposes of this disclosure, if an element is referred to as being "coupled" to another element, it may be directly coupled to the other element, or intervening elements may exist. If an element is referred to as being "directly coupled" to another element, no other intervening elements are intentionally disposed. The terms "substantially the same," "substantially equal," and "approximately the same" describe a quantitative relationship between two objects. This quantitative relationship may prefer the two objects to be equal by design but with the anticipation that a certain amount of variations can be introduced by the fabrication process.

While operations are depicted as occurring in a particular order, this should not be understood as requiring that all illustrated operations be performed to achieve desirable results unless such order is recited in one or more claims. In certain circumstances, multitasking and parallel processing may be advantageous. Moreover, the separation of various system components in the embodiments described above should not be understood as requiring such separation in all embodiments.

What is claimed is:

1. A method for reducing offset drift in an amplifier comprised of:
    receiving a first differential input signal at the control terminal of a first transistor and a second differential input signal at the control terminal of a second transistor;
    coupling a first terminal of the first transistor to a second terminal of a third transistor and a first terminal of the second transistor to a second terminal of a fourth transistor;
    coupling a control terminal of the third transistor to a control terminal of the fourth transistor;
    coupling a first terminal of the fourth transistor to an output terminal;
    generating a temperature dependent error correction current to minimize the difference in the amount of current flowing through the third transistor and the amount of current flowing through the fourth transistor; and
    providing the error correction current to the second terminal of at least one of the third transistor or the fourth transistor.

2. The method of claim 1, wherein the error correction current has an approximately opposite response to a change in temperature compared to a temperature dependent offset error in the amplifier.

3. The method of claim 1, wherein a switch controls whether the polarity of the error correction current is positive or negative.

4. The method of claim 3, wherein the switch can prevent the error correction current from being injected into the third transistor or fourth transistor.

5. The method of claim 1, wherein the error correction current is first generated as an error correction voltage, and the error correction voltage is then input to a transconductance stage that converts the voltage to a current.

6. The method of claim 1, wherein a current source is coupled to a second terminal of the first transistor and a second terminal of the second transistor, raising the voltage at the second terminal of the first transistor and the second terminal of the second transistor above a lower supply voltage.

7. The method of claim 1, wherein a control terminal is a base, a first terminal is a collector, and a second terminal is an emitter.

8. A circuit comprising:
    a first transistor having a control terminal, a first terminal, and a second terminal, the control terminal is coupled to a first differential input terminal, and the second terminal is coupled to a first terminal of an error correction circuit;
    a second transistor having a control terminal, a first terminal, and a second terminal, the control terminal is coupled to a second differential input terminal, the first terminal is coupled to the first terminal of the first transistor, and the second terminal is coupled to a second terminal of the error correction circuit;
    a third transistor having a control terminal, a first terminal, and a second terminal, the first terminal is coupled to the first terminal of the error correction circuit;
    a fourth transistor having a control terminal, a first terminal, and a second terminal, the control terminal is coupled to the control terminal of the third transistor, and the first terminal is coupled to the second terminal of the error correction circuit; and
    an output amplifier stage with an input coupled to the second terminal of the fourth transistor and an output coupled to an output terminal.

9. The circuit of claim 8, wherein the error correction circuit minimizes the difference between the current through the third transistor and the current through the fourth transistor.

10. The circuit of claim 8, wherein the error correction circuit includes a switch that determines whether the current output has a positive polarity or a negative polarity.

11. The circuit of claim 10, wherein the switch can decouple the error correction circuit from the third transistor and the fourth transistor.

12. The circuit of claim 8, further comprising a current mirror coupled between the second terminal of the third transistor and a first voltage source, and between the second terminal of the fourth transistor and the first voltage source.

13. The circuit of claim 12, wherein the control terminal is a base of a transistor, the first terminal is an emitter of a transistor, and the second terminal is a collector of a transistor.

14. The circuit of claim 8, wherein the circuit includes a current source coupled to the first terminal of the first transistor and the first terminal of the second transistor.

15. An error correction circuit comprising:
a first transistor having a control terminal, a first terminal, and a second terminal, the second terminal is coupled to a current source through a first resistor, and the control terminal is coupled to a first differential voltage output and to the first terminal through a second resistor and a third resistor;
a second transistor having a control terminal, a first terminal, and a second terminal, the second terminal is coupled to the current source through a fourth resistor, and the control terminal is coupled to a second differential voltage output through a fifth resistor and to the first terminal through the fifth resistor and a sixth resistor;
a transconductance stage having a differential input coupled to the first differential voltage output and the second differential voltage output, and a differential output coupled to a first differential current output and a second differential current output; and
a polarity selection switch coupled to the first differential current output and the second differential current output, and having a differential error correction current output.

16. The error correction circuit of claim 15, wherein the polarity selection switch determines whether the polarity of the differential error correction current output is positive or negative.

17. The error correction circuit of claim 16, wherein the polarity selection switch can disable the differential error correction current output.

18. The error correction circuit of claim 15, wherein the transconductance stage includes a third transistor and a fourth transistor.

19. The error correction circuit of claim 18, wherein the third transistor and the fourth transistor are between a current source and the differential output of the transconductance stage.

20. The error correction circuit of claim 15, wherein there is at least one temperature where differential voltage across the first differential voltage output and the second differential voltage output is approximately zero.

* * * * *